(12) United States Patent
Kawano

(10) Patent No.: US 7,843,372 B2
(45) Date of Patent: Nov. 30, 2010

(54) D/A CONVERSION CIRCUIT

(75) Inventor: Takahiro Kawano, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 48 days.

(21) Appl. No.: 12/343,625

(22) Filed: Dec. 24, 2008

(65) Prior Publication Data

US 2009/0167579 A1 Jul. 2, 2009

(30) Foreign Application Priority Data

Dec. 28, 2007 (JP) ............................. 2007-339584

(51) Int. Cl.
H03M 1/66 (2006.01)

(52) U.S. Cl. ...................... 341/135; 341/136; 330/288; 327/543

(58) Field of Classification Search ................. 341/135, 341/136, 144; 330/257, 288; 323/315; 327/543
See application file for complete search history.

(56) References Cited

U.S. PATENT DOCUMENTS

| | | | | |
|---|---|---|---|---|
| 5,627,486 A | * | 5/1997 | Gross | 330/288 |
| 5,838,191 A | * | 11/1998 | Opris et al. | 327/543 |
| 5,844,511 A | * | 12/1998 | Izumikawa | 341/136 |
| 5,861,830 A | * | 1/1999 | Cheng et al. | 341/135 |
| 6,608,577 B2 | | 8/2003 | Nishimura | |
| 6,741,195 B1 | * | 5/2004 | Cho | 341/136 |
| 6,831,518 B2 | * | 12/2004 | Blankenship et al. | 330/288 |
| 2002/0008653 A1 | | 1/2002 | Nishimura | |
| 2004/0233087 A1 | * | 11/2004 | Blackburn | 341/144 |

FOREIGN PATENT DOCUMENTS

JP 2002-9623 1/2002

* cited by examiner

Primary Examiner—Howard Williams
(74) Attorney, Agent, or Firm—Young & Thompson

(57) ABSTRACT

In an mode of this invention, a digital/analog conversion circuit, includes: a digital/analog conversion portion which outputs a first current according to an input digital signal; and a first current mirror circuit which generates a mirror current according to the first current and outputs the mirror current as an analog signal, the digital/analog conversion circuit converting the digital signal into the analog signal, and further including: a second current mirror circuit, which generates a first mirror current according to the first current; and a third current mirror circuit, which is connected to a reference voltage, and to which the first mirror current is input, and which generates a second mirror current equal to the first current, according to the first mirror current, between the digital/analog conversion portion and the second current mirror circuit.

15 Claims, 12 Drawing Sheets

|  | DNL [LSB] | INL [LSB] |
|---|---|---|
| DAC100 (Fig. 3) | 0.32 | 5.78 |
| DAC10 (Fig. 6) | 0.70 | 6.77 |
| DAC11 (Fig. 7) | 1.00 | 6.77 |

Fig. 5

D/A CONVERSION CIRCUIT

BACKGROUND OF THE INVENTION

1. Field of the Invention

This invention relates to a digital/analog conversion circuit.

2. Description of Related Art

FIG. 11 is a block diagram of an Ultra Wide Band (UWB) receiver or similar. First, signals received by the antenna 1 are selected in the frequency band of the band-pass filter BPF 2, and are amplified by the low-noise amplifier LNA 3. The amplified signals are demodulated by the quadrature demodulation portion 4, and are sent as baseband signals to the low-pass filter LPF 5. After high-frequency components are removed by the low-pass filter LPF 5, signals are amplified to a prescribed signal level by a variable-gain amplifier VGA 6. This variable-gain amplifier VGA 6 adjusts the gain according to the signal reception strength of the antenna 1.

Because the variable gain amplifier VGA used in such a receiver or similar generally has high gain, large offsets occur due to variability among elements. In a UWB receiver in particular, when an offset occurring in the VGA remains, reception characteristics are impacted through degradation of communication distances and in other ways, so that the offset voltage must be removed. One method to remove the offset voltage utilizes a digital/analog conversion circuit (hereafter called a "DAC"). A DAC is a circuit which converts a digital quantity into an analog quantity. A DAC must accurately output the analog quantity which corresponds to an input digital quantity. Moreover, the DAC output mode may be a current output mode or a voltage output mode.

Below, a current-output DAC 10 of the related art is explained using FIG. 12. The DAC 10 includes a digital/analog conversion portion 20 and a current mirror circuit 30.

The digital/analog conversion portion 20 includes a reference current source 21, a plurality of switches S22 to S29, and NMOS transistors MN21 to MN29. The switches S22 to S29 are turned on and off according to digital codes input to the DAC 10. The reference current supply 21 is connected between the power supply voltage terminal VDD (supplied voltage VDD) and the transistor MN21, and supplies a constant current I4 to the transistor MN21. The drains of the transistors MN22 to MN29 are connected to the switches S22 to S29, the sources are connected to the ground terminal GND, and the gates are connected to the reference current supply 21. Hence the transistors MN22 to MN29 form a current mirror circuit which employs the transistor MN21 as the input transistor. Hence the transistors MN22 to MN29 pass constant source currents according to the constant current I4.

The numerals "×1", "×2", "×4", . . . appearing above the switches S22 to S29 indicate the factor by which the current flowing through the transistor MN22 is multiplied. Hence the current in transistor MN23 is 2 times the current flowing in transistor MN22, and the current in transistor MN24 is 4 times the current flowing in transistor MN22. This is achieved by adjusting the gate widths W of the transistors. Also, the ratios of the current amounts are digit weightings for each bit of an input digital code.

The current mirror circuit 30 includes PMOS transistors MP31 and MP32. The transistors MP31 and MP32 form a current mirror which uses the transistor MP31 as the input transistor. Hence a current mirror current I2 is output from the transistor MP32 according to the current I1 flowing in the transistor MP31.

Digital code signals are input to the DAC 10, and the switches S22 to S29 of the digital/analog conversion portion 20 are turned on and off according to the digital code. At this time, current flows in those transistors MN22 to MN29 which are connected to on-state switches. Currents flow in the transistors connected to the on-state switches in quantities according to the digit weightings of the bits of the digital code, as explained above. Hence the sum of the currents flowing in transistors connected to those switches which have been turned on according to the digital code is output from the digital/analog conversion portion 20 The summed current is the above-described current I1, and a mirror current I2 corresponding to the current I1 is output from the output terminal 40 as the output analog signal of the DAC 10.

Here, the potential at node P in FIG. 12 is expressed by the following equation.

[E1]
$$V(P) = V_{DD} - \sqrt{\frac{2I_{MP31}L_{MP31}}{K_P W_{MP31}}} - V_{TP} \quad (1)$$

Here, V(P) in equation (1) is the potential at node P, VDD is the power supply voltage, $V_{TP}$ is the PMOS transistor threshold voltage, $I_{MP31}$ is the source-drain current of the transistor MP31, $K_P$ is the product of the carrier mobility ($\mu_P$) and the gate oxide film capacitance (Cox) of PMOS transistors, $L_{MP31}$ is the gate length of the transistor MP31, and $W_{MP31}$ is the gate width of the transistor MP31.

In equation (1), the variable is $I_{MP31}$. This is because the current $I_{MP31}$ is the same as the current I1, so that the current $I_{MP31}$ changes according to the input digital code.

Further, a transistor current in general can be represented as follows.

[E2]
$$I_{DS} = \frac{1}{2} K \frac{W}{L} (V_{GS} - V_T)^2 \quad (2)$$

Here $I_{DS}$ in equation (2) is the drain-source current, K is the product of the carrier mobility and the gate oxide film capacitance for the PMOS or NMOS transistor, W is the transistor gate width, L is the transistor gate length, $V_{GS}$ is the gate-source voltage, and VT is the transistor threshold voltage. However, more rigorously, equation (2) should also include the factor $(1+\lambda V_{DS})$, as in equation (3) below.

[E3]
$$I_{DS} = \frac{1}{2} K \frac{W}{L} (V_{GS} - V_T)^2 (1 + \lambda V_{DS}) \quad (3)$$

Because of this factor $(1+\lambda V_{DS})$, when there is fluctuation in $V_{DS}$, the current $I_{DS}$ also fluctuates. This fluctuation is called the Early effect.

As is seen from equation (1), the potential V(P) at node P fluctuates due to $I_{MP31}$(=I1). In the transistors MN22 to MN29, this fluctuation in the potential V(P) becomes fluctuations in $V_{DS}$ in equation (3), so that $I_{DS}$ fluctuates. Hence the balance of the digit weightings for each bit of an input digital code is worsened, and there is the problem that the linearity of the digital/analog conversion deteriorates. Indices indicating deterioration of this linearity include Integral Non Linearity (INL) and Differential Non Linearity (DNL).

In Japanese Unexamined Patent Application Publication No. 2002-9623, technology is disclosed which has as an object improvement of the precision of the current mirror ratio of a current mirror circuit. However, in Japanese Unexamined Patent Application Publication No. 2002-9623, the circuit configuration is such that there is voltage fluctuation at the node between the digital/analog conversion portion (D/A conversion portion) and the current mirror (CM), and due to the abovementioned Early effect, there is the problem that the linearity of digital/analog conversion deteriorates.

SUMMARY

The present inventors have found a problem as follows. As explained above, in a DAC 10 of the related art, the current $I_{MP31}$ flowing in the input transistor of the current mirror circuit 30 changes according to the input digital code. Due to this change in the current, the potential fluctuates at the output point of the digital/analog conversion portion 20, that is, at node P. Due to the Early effect in transistors included by the digital/analog conversion portion 20, this potential fluctuation causes the transistor drain-source currents $I_{DS}$ to fluctuate. For this reason, the balance of digit weightings for each bit in the current output from the digital/analog conversion portion 20 is worsened. As a result, there is the problem that the linearity of digital/analog conversion of the DAC 10 deteriorates. A similar problem occurs in the circuit of Japanese Unexamined Patent Application Publication No. 2002-9623 as well.

In an mode of this invention, a digital/analog conversion circuit, includes: a digital/analog conversion portion which outputs a first current according to an input digital signal; and a first current mirror circuit which generates a mirror current according to the first current and outputs the mirror current as an analog signal, the digital/analog conversion circuit converting the digital signal into the analog signal, and further including: a second current mirror circuit, which generates a first mirror current according to the first current; and a third current mirror circuit, which is connected to a reference voltage, and to which the first mirror current is input, and which generates a second mirror current equal to the first current, according to the first mirror current, between the digital/analog conversion portion and the second current mirror circuit.

By means of a digital/analog conversion circuit of this invention, a voltage equal to a reference voltage can be generated between a third current mirror circuit and the digital/analog conversion portion.

In another mode of this invention, a digital/analog conversion circuit includes: a digital/analog conversion portion which outputs a first current and a second current in a differential relationship according to input digital signals; and first and fourth current mirror circuits which generate mirror currents according to the first and second currents for output as differential analog signals, the digital/analog conversion circuit converting digital signals into analog signals, and further including: a second current mirror circuit, which generates a first mirror current according to the first current; a third current mirror circuit, which is connected to a reference voltage, and to which the first mirror current is input, and which generates a second mirror current equal to the first current, according to the first mirror current, between the digital/analog conversion portion and the second current mirror circuit; a fifth current mirror circuit, which generates a third mirror current according to the second current; and a sixth current mirror circuit, which is connected to the reference voltage, and to which the third mirror current is input, and which generates a fourth mirror current equal to the second current, according to the third mirror current, between the digital/analog conversion portion and the fifth current mirror circuit.

By means of a digital/analog conversion circuit of this invention, deterioration of the linearity of digital/analog conversion can be suppressed.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 5 is a table comparing characteristics of the DAC circuit of the first exemplary embodiment and a circuit of the related art;

DETAILED DESCRIPTION OF THE PREFERRED EMBODIMENTS

First Exemplary Embodiment

Figure 1:
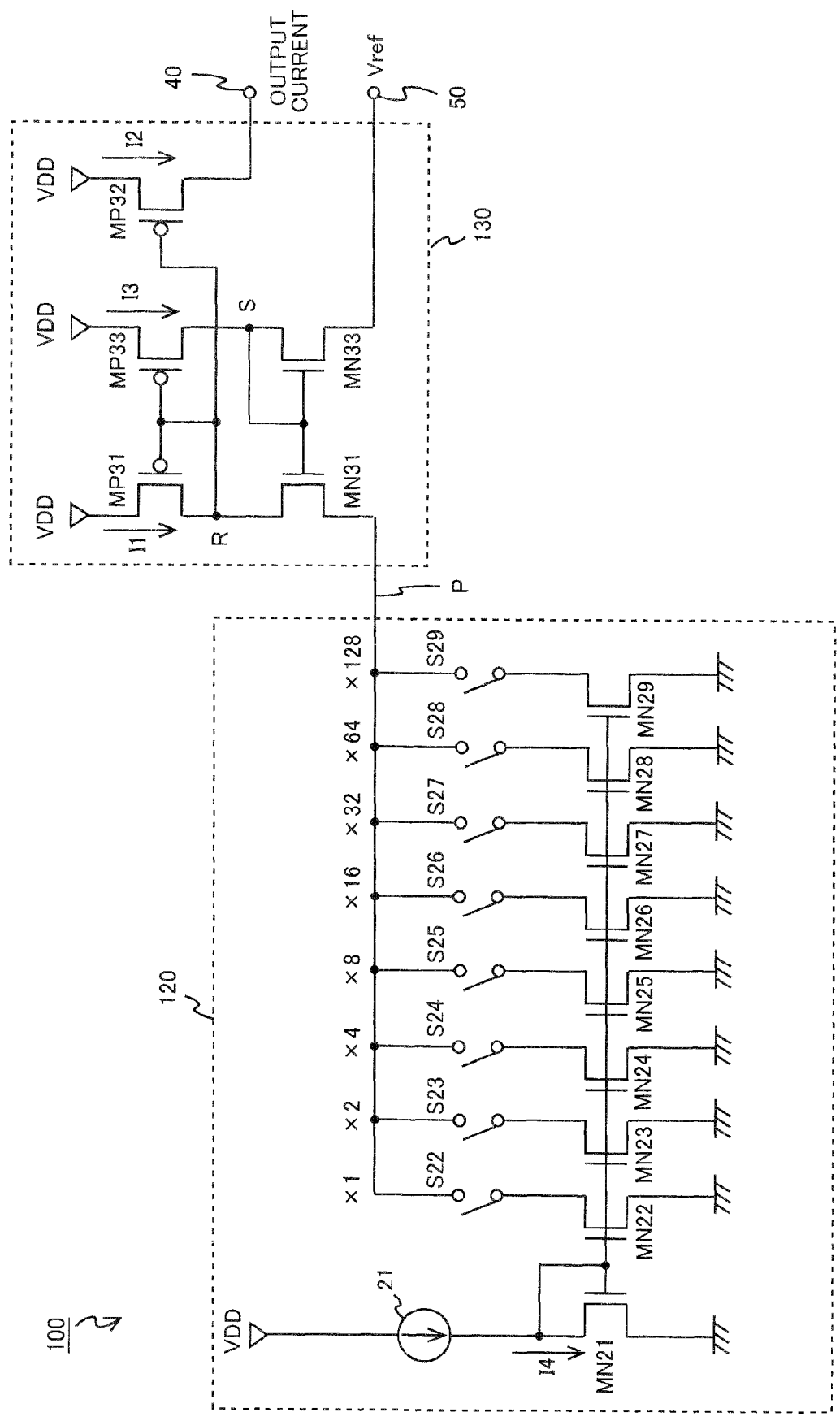
FIG. 1 shows the circuit configuration of the DAC circuit of a first exemplary embodiment.

Below, a specific the first exemplary embodiment to which the invention is applied is explained in detail, referring to the drawings. FIG. 1 shows an example of the configuration of the digital/analog conversion circuit 100 of the first exemplary embodiment.

As shown in FIG. 1, the digital/analog conversion circuit 100 includes a digital/analog conversion portion 120 and an output-stage current mirror circuit 130. The digital/analog conversion portion 120 and output-stage current mirror circuit 130 are connected at node P.

Upon input of a digital code, the digital/analog conversion portion 120 outputs a current, in a quantity corresponding to the digital code, to the output-stage current mirror circuit 130. Here, assume that an 8-bit digital code is input. The digital/analog conversion portion 120 includes a reference current source 21, NMOS transistors MN21 to MN29, and switches S22 to S29. The reference current source 21 is connected between the power supply voltage terminal VDD (supplied voltage VDD) and transistor MN21, and supplies a constant current I4 to transistor MN21. The drain and gate of the transistor MN21 are connected to the reference current source 21, and the source is connected to the ground terminal GND.

One terminal of each of the switches S22 to S29 is connected to the node P, and the other terminal is connected to the drain of the respective transistor MN22 to MN29. The switches S22 to S29 are turned on and off according to the input digital code. For example, when the input digital code is "0", a switch is turned off, and when the digital code is "1", a switch is turned on. More specifically, when the LSB (least significant bit) of the input digital code corresponds to switch S22, and the MSB (most significant bit) corresponds to switch S29, upon input of the digital code "11000001" in MSB-_FIRST mode, switches S22, S28, and S29 are turned on.

The drains of the transistors MN22 to MN29 are connected to the other terminals of the switches S22 to S29, the sources are connected to the ground terminal GND, and the gates are connected to the reference current source 21. Hence the transistors MN22 to MN29 form current mirror circuits which employ the transistor MN21 as an input transistor. Thus when the connected switches are turned on, the transistors MN22 to MN29 pass a constant source current according to the constant current I4.

The numerals "×1", "×2", ..., "×64", "×128" appearing above the paths of current flowing in the transistors MN22 to MN29 indicate the factor by which the current flowing through the transistors MN22 to MN29 is multiplied by the current in the transistor MN22. Hence when for example switch S23 is turned on, the amount of current flowing in transistor MN23 is twice the amount of current flowing in transistor MN22 when switch S22 is turned on. Similarly, when switch S29 is turned on, the amount of current flowing in transistor MN29 is 128 times the amount of current flowing in transistor MN22 when switch S22 is turned on. The ratio of the current amount corresponds to the digit weighting of the input digital code. The current ratios are attained by adjusting and designing the ratios of the gate widths of the various transistors.

The output-stage current mirror circuit 130 includes PMOS transistor MP31, MP32, MP33, and NMOS transistors MN31, MN33. The source of the transistor MP31 is connected to the power supply voltage terminal VDD, and the drain and gate are connected to the node R. The source of the transistor MP32 is connected to the power supply voltage terminal VDD, the drain is connected to the output terminal 40, and the gate is connected to the node R. The source of the transistor MP33 is connected to the power supply voltage terminal VDD, the drain is connected to the node S, and the gate is connected to the node R. The drain of the transistor MN31 is connected to the node R, the source is connected to the node P, and the gate is connected to the node S. The drain and gate of the transistor MN33 are connected to the node S, and the source is connected to the reference voltage terminal 50. The reference voltage Vref is supplied to the reference voltage terminal 50.

The transistors MP32 and MN33 form first and second current mirror circuits, employing the transistor MP31 as an input transistor. The transistor MN31 forms a third current mirror circuit, employing the transistor MN33 as an input transistor. Hence when the current I1 (first current) flows in the transistor MP31, a mirror current I3 (second mirror current) flows in transistor MP33 corresponding to current I1. Similarly, a mirror current I2 (first mirror current) flows in transistor MP32 corresponding to current I1. This current I2 is output from the output terminal 40 as the output current of the DAC 100.

Here, the gate widths W and gate lengths L of the transistors MP31, MP32, MP33 are respectively $W_{MP31}$, $L_{MP31}$, $W_{MP32}$, $L_{MP32}$, $W_{MP33}$, $L_{MP33}$, and the gate widths W and gate lengths L of the transistors MN31 and MN33 are respectively $W_{MN31}$, $L_{MN31}$, $W_{MN33}$, $L_{MN33}$.

In the first exemplary embodiment, transistors are formed such that the ratios $W_{MP31}/L_{MP31}$ and $W_{MP32}/L_{MP32}$ are equal to C. Moreover, transistors are formed such that the ratios $W_{MN31}/L_{MN31}$ and $W_{MN33}/L_{MN33}$ are equal to C. At this time, under these conditions, the relation between the above currents I1 and I3 is I1/I3=C.

The circuit operation of the output-stage current mirror circuit 130 configured as described above is explained below. First, a current corresponding to the input digital code is output to node P from the digital/analog conversion portion 120. This current is the above-described current I1. As a result, a gate-source voltage $Vgs_{MP31}$ appears across the transistor MP31, corresponding to the current I1. The transistor MP33 and transistor MP31 form a current mirror circuit which have the transistor MP31 as an input transistor. Hence a mirror current I3 corresponding to the current I1, that is, corresponding to the gate voltage VDD-$Vgs_{MP31}$, flows between the source and drain of the transistor MP33. As explained above, the ratio of the gate width W to the gate length L of the transistors MP31 and MP33 is C, so that the current I3 is I3=I1/C.

The transistor MP33 and transistor MN33 are on the same current path, so that the current I3 also flows in transistor MN33. A gate-source voltage $Vgs_{MN33}$ appears across transistor MN33 corresponding to the current I3. The transistor MN33 and transistor MN31 form a current mirror circuit which has the transistor MN33 as the input transistor Hence a mirror current corresponding to the current I3 flows between drain and source of the transistor MN31. As explained above, the gate width W/gate length L ratio of the transistors MN31 and MN33 is also C, so that the mirror current flowing in this transistor MN31 is equal to the current I1 flowing in the transistor MP31. The current I1 is supplied to the digital/analog conversion portion 120.

The current I3 is determined according to the current I1, that is, but the gate-source voltage of the transistor MP33, and the current I1 flowing in the transistor MN31 is determined according to the current I3, that is, the gate-source voltage of the transistor MN33. From these facts, it is seen that the gate-source voltage $Vgs_{MN33}$ of the transistor MN33 and the gate-source voltage $Vgs_{MN31}$ of the transistor MN31 are equal. This obtains due to the fact that the ratio of the gate width W to the gate length L of the transistors MP31 and MP33 and the ratio of the gate width W to the gate length L of the transistors MN31 and MN33 are both equal to C.

The source of the transistor MN33 is connected to the reference voltage terminal 50. As a result, the source voltage of the transistor MN33 is the reference voltage Vref Also, a gate-source voltage $Vgs_{MN33}$ occurs across the transistor MN33 according to the current I3. As a result, the potential at the node S is $Vgs_{MN33}$+Vref. Here, the gates of the transistors MN31 and MN33 are connected in common to node S. As a result, the gate voltage of the transistor MN31 is also $Vgs_{MN33}$+Vref. Consequently, as explained above, the gate-source voltages $Vgs_{MN33}$ and $Vgs_{MN33}$ of the transistors MN31 and MN33 are equal, so that the source voltage of the transistor MN31 is Vref. That is, the voltage at node P is Vref.

The above may be represented by equations as follows. Here, the gate width of the transistor MP31 is $W_{MP31}$ and the gate length is $L_{MP31}$; the gate width of the transistor MP33 is $W_{MP33}$ and the gate length is $L_{MP33}$; the gate width of the transistor MN31 is $W_{MN31}$ and the gate length is $L_{MN31}$; and the gate width of the transistor MN33 is $W_{MN33}$ and the gate length is $L_{MN33}$. The currents flowing in transistors MP31, MP33, MN31, MN33 are $I_{MP31}$, $I_{MP33}$, $I_{MN31}$, $I_{MN33}$. Here, $I1=I_{MP31}=I_{MN31}$, and $I3=I_{MP33}=I_{MN33}$. The potentials at nodes R, S and P are V(R), V(S), V(P). The products of the carrier mobilities μp, μn and the gate oxide film capacitance Cox for the PMOS transistors and NMOS transistors are $K_P$ and $K_N$. The threshold voltages of the PMOS transistors and NMOS transistors are $V_{TP}$ and $V_{TN}$.

First because the ratio of the gate width W to the gate length L of the transistors MP31 and MP33, and the ratio of the gate width W to the gate length L of the transistors MN31 and MN33, are both equal to C, equation (4) is obtained.

[E4]
$$\frac{W_{MP31}/L_{MP31}}{W_{MP33}/L_{MP33}} = \frac{W_{MN31}/L_{MN31}}{W_{MN33}/L_{MN33}} = C \quad (4)$$

The potentials at node R and node S are given by equations (5) and (6).

[E5]
$$V(R) = V_{DD} - \sqrt{\frac{2I_{MP31}L_{MP31}}{K_P W_{MP31}}} - V_{TP} \quad (5)$$

[E6]
$$V(S) = V_{ref} + \sqrt{\frac{2I_{MN33}L_{MN33}}{K_N W_{MN33}}} + V_{TN} \quad (6)$$

From equation (4) and the current mirror configuration of transistors MP31 and MP33 and transistors MN31 and MN33, equation (7) is obtained.

[E7]
$$I_{MP31} = \frac{W_{MP31}/L_{MP31}}{W_{MP33}/L_{MP33}} I_{MP33} = \frac{W_{MN31}/L_{MN31}}{W_{MN33}/L_{MN33}} I_{MN33} = I_{MN31} \quad (7)$$

The gate voltage of transistor MN31 is the potential V(S) at node S. Hence the source-drain current $I_{MN31}$ in transistor MN31 is given by equation (8), using V(S) and V(P).

[E8]
$$I_{MP31} = \frac{1}{2}K_N \frac{W_{MN31}}{L_{MN31}}(V(S) - V(P) - V_{TN})^2 \quad (8)$$

Rearranging equation (8) using equations (6) and (7), equation (9) is obtained.

[E9]
$$V(P) = V_{ref} \quad (9)$$

It is seen that by means of the output-stage current mirror circuit 130 of the first exemplary embodiment described above, the potential at node P, that is, the potential of the current output point of the digital/analog conversion portion 120 can be fixed at Vref. This means that even when the current output from the digital/analog conversion portion changes due to the input digital code, the potential at node P does not change. Hence the problem in a DAC 10 of the related art, in which the balance of digit weightings for tran-sistors included by the digital/analog conversion portion is worsened, due to the Early effect resulting from fluctuations in the potential at node P, can be resolved. And, by changing the Vref supplied from the reference voltage terminal 50, the voltage at node P can also be changed.

The output-stage current mirror circuit 130 in the first exemplary embodiment can be applied to all current output-type DACs; by means of this output-stage current mirror circuit 130, the voltage at the current output point (node P) of the digital/analog conversion portion can be fixed at a constant value. Below are described examples of variations on the circuit configuration of the digital/analog conversion portion to which the output-stage current mirror circuit 130 is connected.

Figure 2:
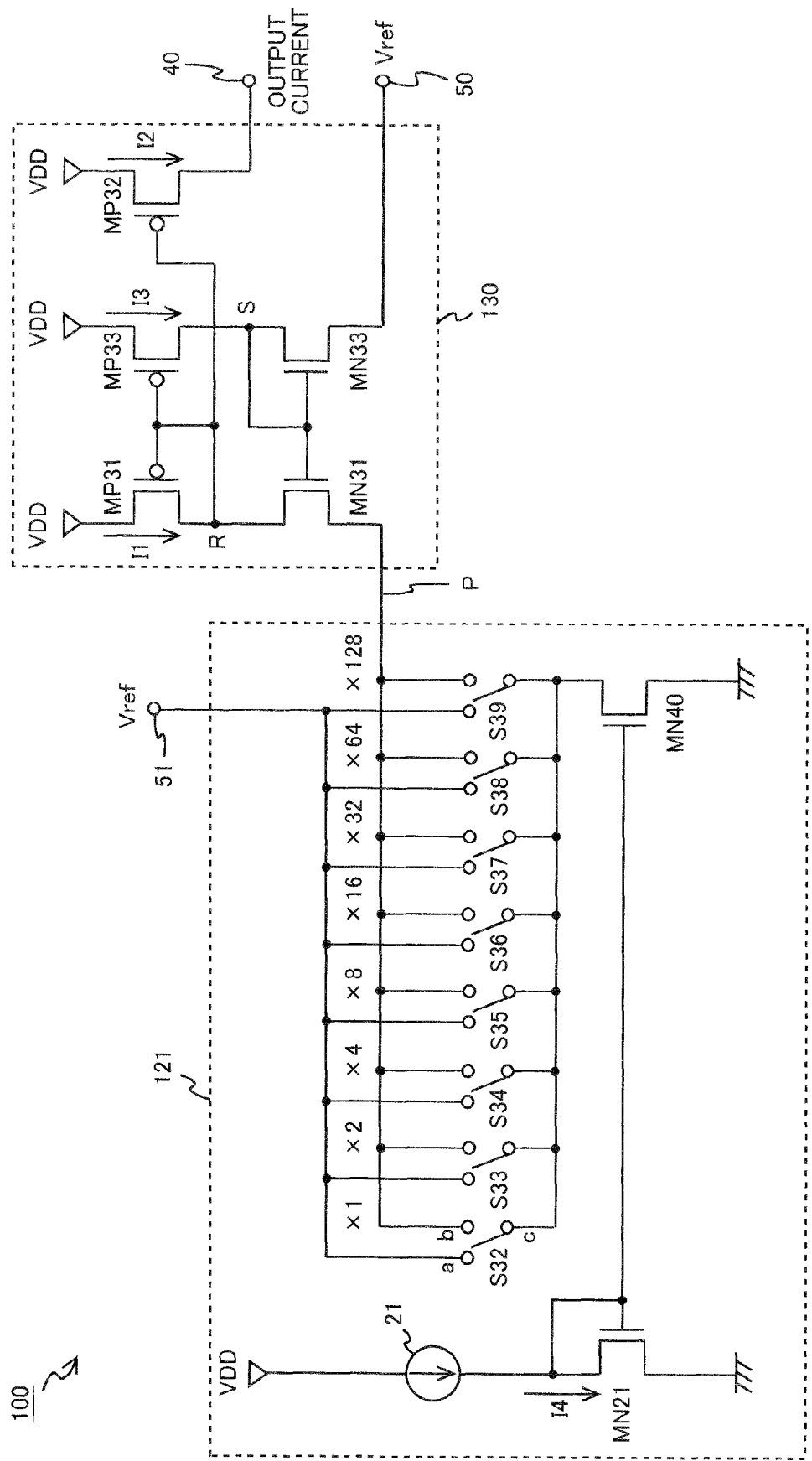
FIG. 2 is an example of another circuit configuration of the DAC circuit of the first exemplary embodiment.

FIG. 2 shows a DAC 100 having the digital/analog conversion portion 121 of a segment current type DAC. The digital/analog conversion portion 121 includes a reference current source 21, NMOS transistors MN21 and MN40, and switches S32 to S39. The reference current source 21 is connected between the power supply voltage terminal VDD (supplied voltage VDD) and the transistor MN21, and supplies a constant current I4 to the transistor MN21. The drain and gate of the transistor MN21 are connected to the reference current source 21, and the source is connected to the ground terminal GND.

The switches S32 to S39 each include three terminals, a, b and c; one among terminal a and terminal b is connected to terminal c according to the input digital code. For example, when the LSB of the input digital code corresponds to switch S32 and the MSB corresponds to switch S39, upon input of the digital code "11000001", the terminals b of switches S32, S38 and S39 are connected to the terminals c, and the terminals a of the other switches are connected to the terminals c. The terminals a of the switches S32 to S39 are connected to the reference voltage terminal 51, supplying the reference voltage Vref. Because it is sufficient to supply the same voltage as at the reference voltage terminal 50 to the terminals a, the terminals a may be connected directly to the reference voltage terminal 50. The terminals b are connected to the node P. The terminals c are connected to the drain of the transistor MN40.

The drain of transistor MN40 is connected to the terminals c of switches S32 to S39, the source is connected to the ground terminal GND, and the gate is connected to the reference current source 21. Hence the transistor MN40 forms a current mirror circuit employing the transistor MN21 as the input transistor. Consequently the transistor MN40 passes a constant source current corresponding to the constant current I4 as a mirror current.

In the digital/analog conversion portion 121 of the segment current type DAC, as the current source, a single transistor MN40 generates the current output to the node P. Hence the current amounts flowing in the switches corresponding to the digit weightings of the input digital code are generated at the ratios of the turn-on resistances of the respective switches. For example, if the resistance value of the turn-on resistance of switch S32 is R, then the resistance value of switch S33 is R/2, the resistance value of switch S34 is R/4, and similarly for the other switches.

When the state of connection of the terminals b and c for each switch is switched to connection of terminals a and c, the reference voltage terminal 51 which supplies the reference voltage Vref prevents changes in the current flowing in switches other than the switched switch. For example, if the reference voltage Vref is not supplied to the terminal a of a switch by this reference voltage terminal 51, when the number of switches which connect terminals c and b changes, the transistor MN40 attempts to pass a constant current as described above, so that the current flowing in a switch which connects terminals c and b changes. Hence the digit weighting assigned to the current amounts flowing in each switch change, and the linearity of digital/analog conversion deteriorates. Hence by connecting the reference voltage terminal 51, which supplies the same voltage Vref as the reference voltage terminal 50 and the node P, to the terminals a of each of the switches, deterioration of the linearity of digital/analog conversion is prevented.

Here, a DAC having a circuit configuration such as the digital/analog conversion portion 120 of FIG. 1 is called a current cell type DAC, and a DAC having a circuit configuration such as the digital/analog conversion portion 121 of FIG. 2 is called a segment current type DAC. A segment current type DAC requires little current flowing in the digital/analog conversion portion, and so has the advantage of consuming less power than a current cell type DAC. However, the impact on linearity of fluctuations in the voltage of the current output point (node P) of the digital/analog conversion portion is greater than for a current cell type DAC. Hence when, as in FIG. 2, the output-stage current mirror circuit 130 of the first exemplary embodiment is used in a segment current type DAC, the voltage at node P can be fixed, and so there is a greater advantageous result of improving the linearity of digital/analog conversion.

Figure 3:
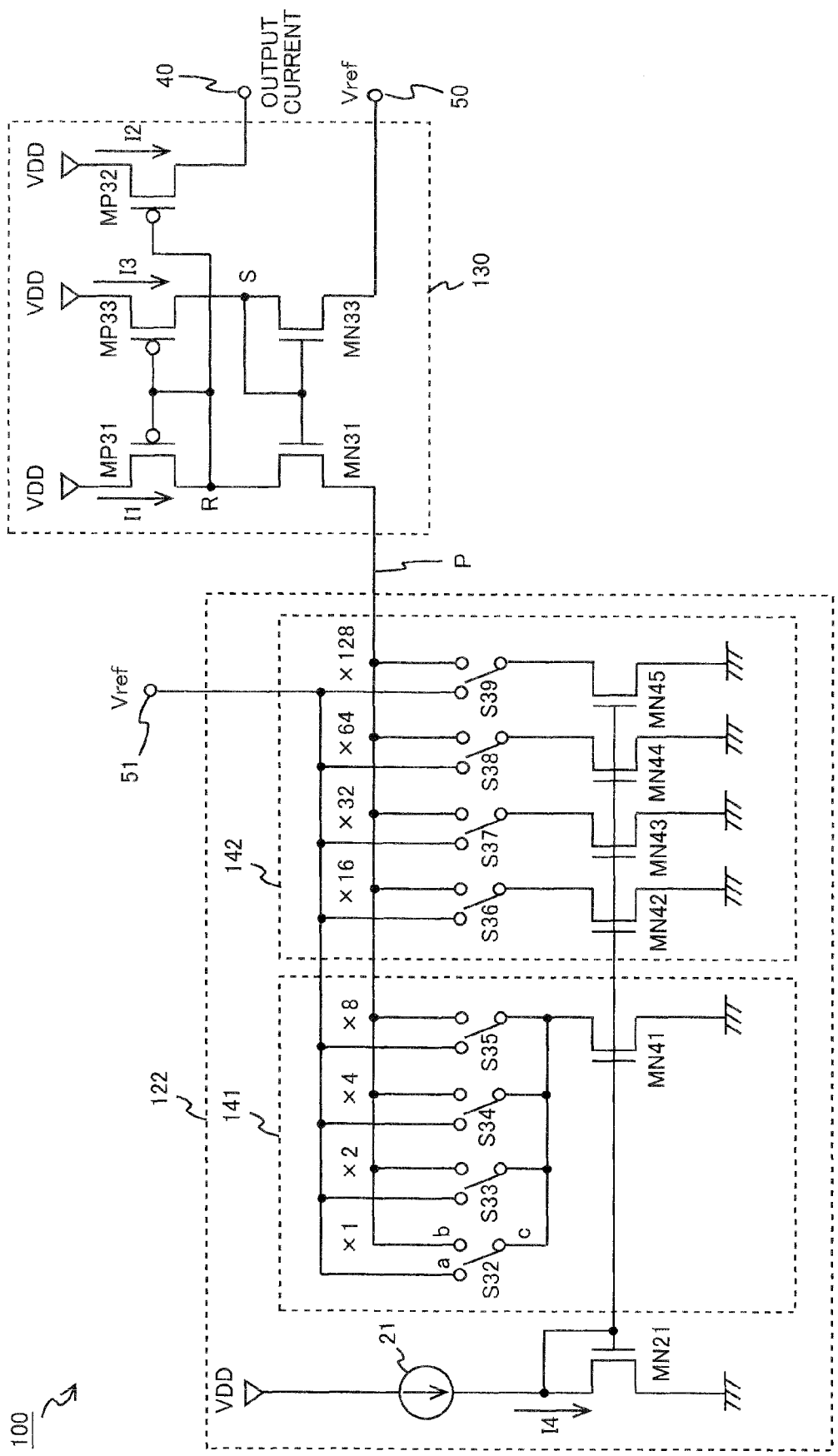
FIG. 3 is an example of another circuit configuration of the DAC circuit of the first exemplary embodiment.

As shown in FIG. 3, the DAC 100 may include a digital/analog conversion portion 122 having both the segment current type and the current cell type circuit configurations. As shown in FIG. 3, the digital/analog conversion portion 122 includes a reference current source 21, NMOS transistors MN21 and MN41 to MN45, and switches S32 to S39. The switches S32 to S35 and transistor MN41 form a segment current type circuit 141, and the switches S36 to S39 and transistors MN42 to MN45 form a current cell type circuit 142. The NMOS transistors MN41 to MN45 form a current mirror circuit, with transistor MN21 as the input transistor. Similarly to FIG. 2, the switches S32 to S39 each have three Terminals a, b and c, and one of the terminals a or b is connected to terminal c depending on the input digital code. Terminals a are connected to the reference voltage terminal 51, and terminals b are connected to the node P. The voltage at the current output point (node P) can be fixed at a constant value even when the output-stage current mirror circuit 130 of the first exemplary embodiment is connected to such a digital/analog conversion portion having both the segment current type and the current cell type circuit configurations, and the linearity of digital/analog conversion of the DAC 100 can be improved.

The following is a reason for combining segment current type and current cell type configurations in the digital/analog conversion portion. A segment current type circuit configuration divides the output current by the switch turn-on resistances, so that power consumption is reduced. On the other hand, in a current cell type circuit configuration, power consumption is high, but fast operation is possible. By combining such different types of circuit configurations, a circuit can be configured which exploits the advantages of both types.

Figure 4:
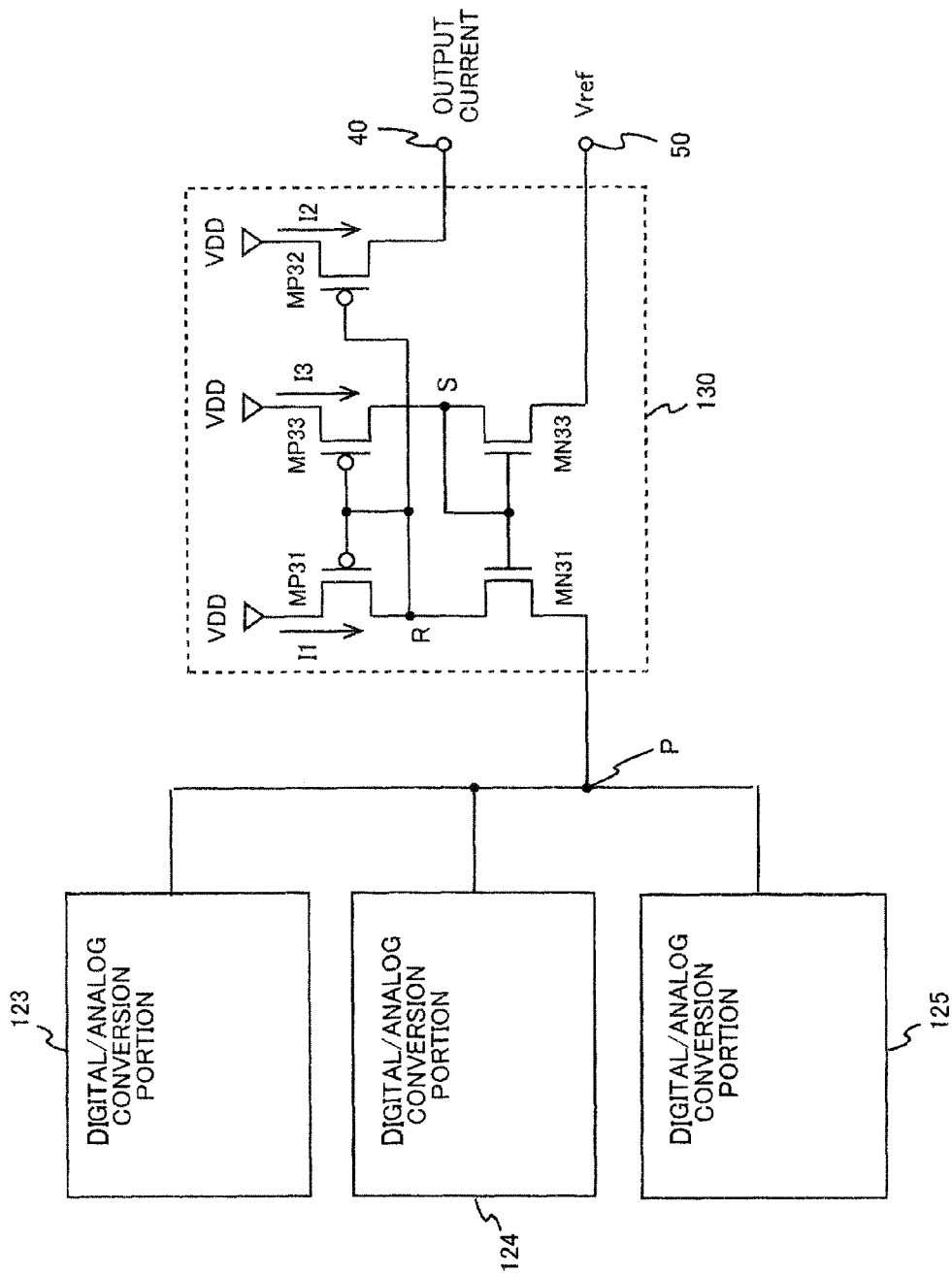
FIG. 4 is an example of another circuit configuration of the DAC circuit of the first exemplary embodiment.

Further, as shown in the block diagram of FIG. 4, a plurality of digital/analog conversion portions may be connected to node P, as in 123 through 125.

Figure 6:
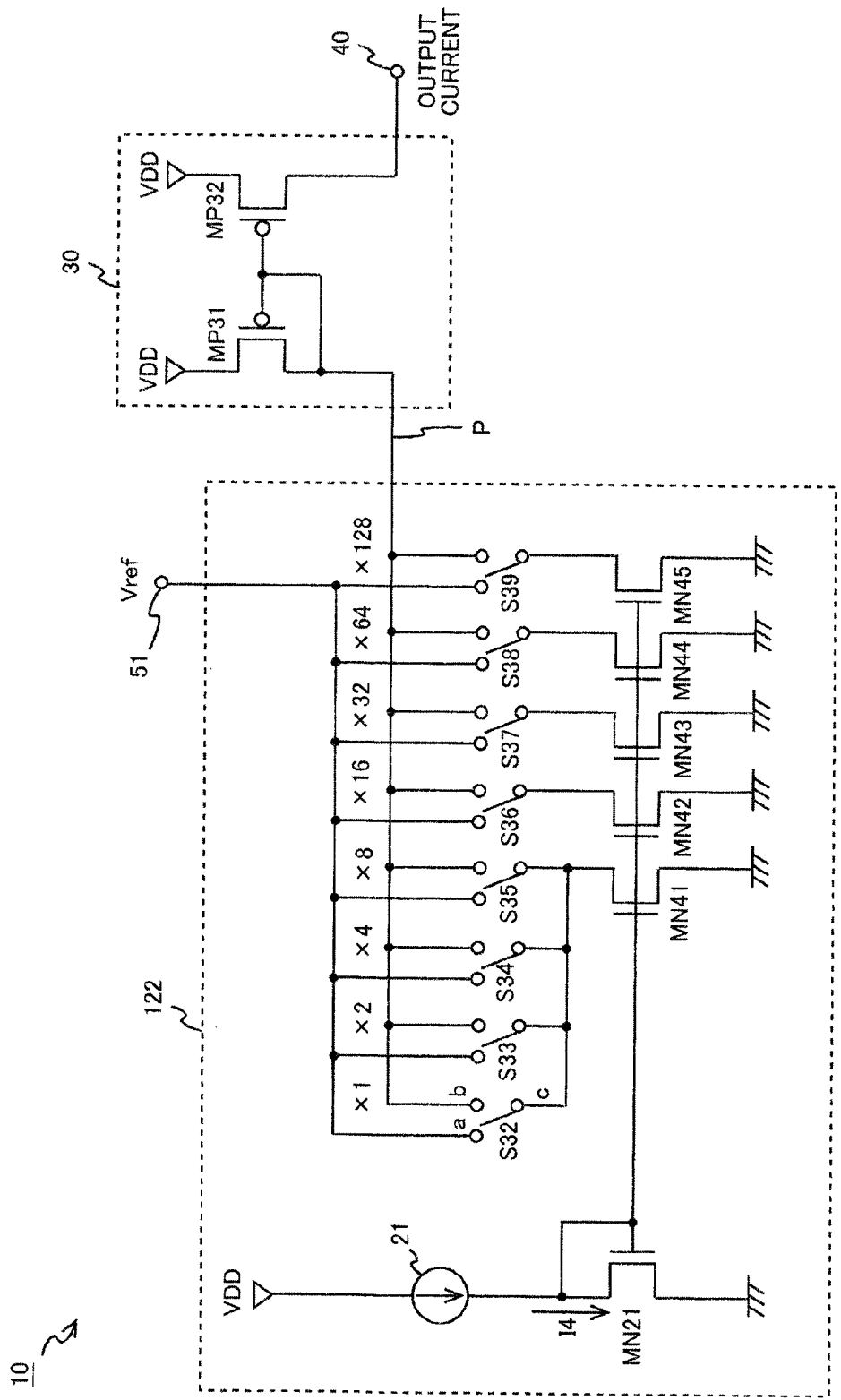
FIG. 6 shows the circuit configuration of a DAC circuit of the related art.
Figure 7:
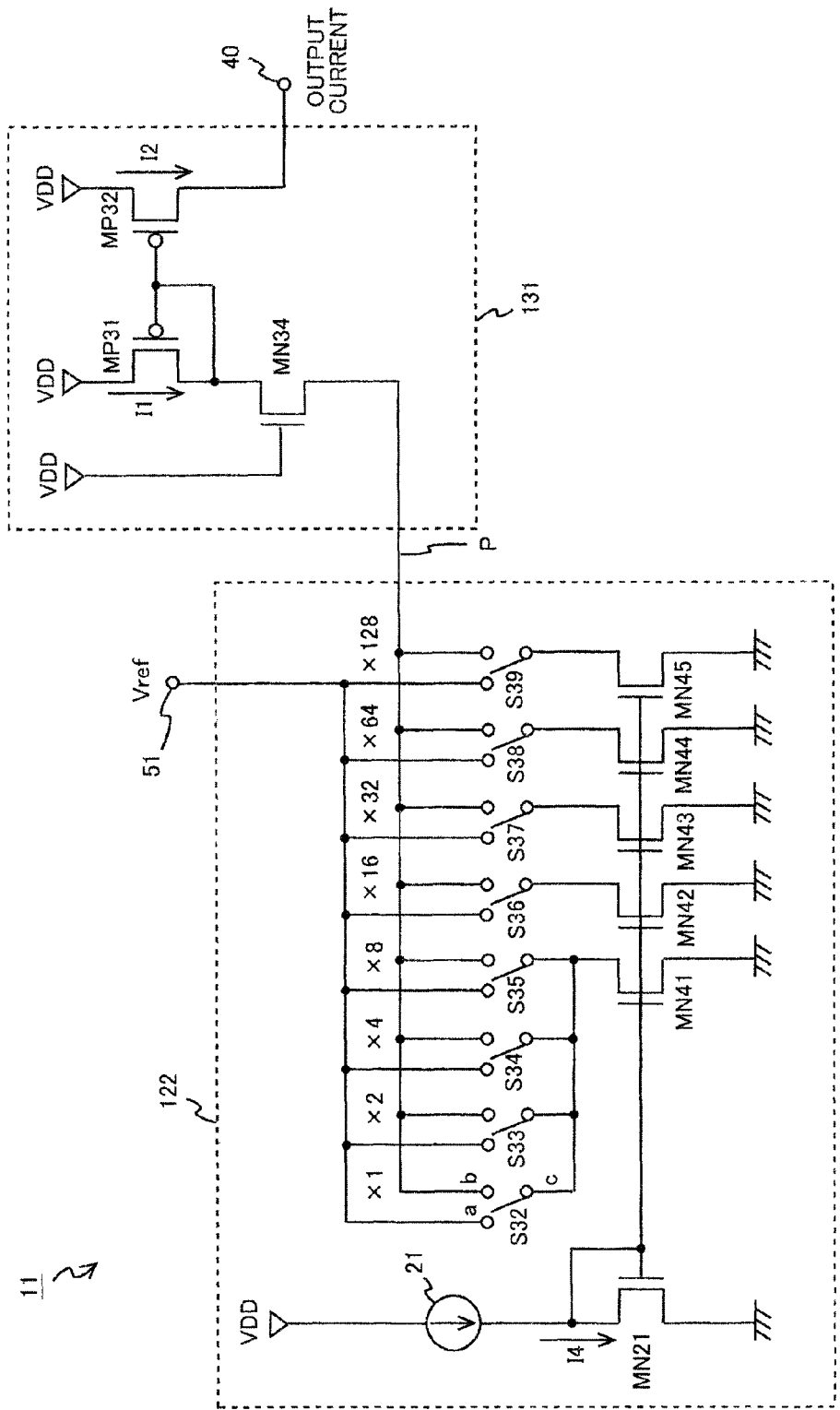
FIG. 7 shows the circuit configuration of a DAC circuit of the related art.

The table of FIG. 5 shows the results of simulations of DNL and INL characteristics for the DAC 100 of the first exemplary embodiment shown in FIG. 3, the DAC 10 of the related art shown in FIG. 6, and the DAC 11 shown in FIG. 7. Here, the DAC 11 shown in FIG. 7 includes a configuration in which a gate grounding circuit (NMOS transistor MN34) is added to the DAC 10 of FIG. 6. Also, the power supply voltage VDD is 1.14 V. The DACs shown in FIG. 3, FIG. 6 and FIG. 7 all combine segment current type and current cell type configurations in the digital/analog conversion portion. An explanation of such digital/analog conversion portions which combine segment current type and current cell type configurations has been given using FIG. 3, and is here omitted.

As is seen from the table of FIG. 5, among the DAC 100 of the first exemplary embodiment and the DAC 10 of the related art, both the DNL and the INL characteristics are superior for the DAC 100. This is because, as explained above, the voltage at the current output point (node P) of the digital/analog conversion portion of the DAC 100 is fixed, and the Early effect is suppressed.

Here, the output-stage current mirror circuit 131 of the DAC 11 shown in FIG. 7 has a circuit configuration in which an NMOS transistor MN34 is inserted between the transistor MP31 of the output-stage current mirror circuit 30 of FIG. 6 and node P. The gate of the transistor MN34 is connected to the power supply voltage terminal, and is supplied with the power supply voltage VDD. In a DAC 11 with this circuit configuration, the potential at node P is determined by the difference between the power supply voltage VDD and the gate-source voltage $Vgs_{MN34}$ of the transistor MN34, and can be substantially fixed. Hence similarly to the DAC 100, the digital/analog linearity is not deteriorated, and it is thought that DNL and INL characteristics with better linearity than that of the DAC 10 can be obtained.

However, in the simulation results of FIG. 5, characteristics are worsened compared with the DAC 10. This occurs because, when the power supply voltage VDD is set to a low power supply voltage such as 1.14 V, upon inserting a gate-grounded circuit (transistor MN34) between the power supply voltage VDD and the current output point (node P), the potential at the current output point (node P) is lowered further. In the circuit of FIG. 7, under the worst conditions of a low power supply voltage, the power supply voltage appears to be even further lowered from the perspective of the digital/analog conversion portion, leading to worsened characteristics. On the other hand, in the DAC 100 of the first exemplary embodiment, excellent DNL and INL characteristics are obtained even for such a lowered power supply voltage, and it is seen that the DAC 100 is suitable for application to devices operating at a lowered power supply voltage.

Figure 8:
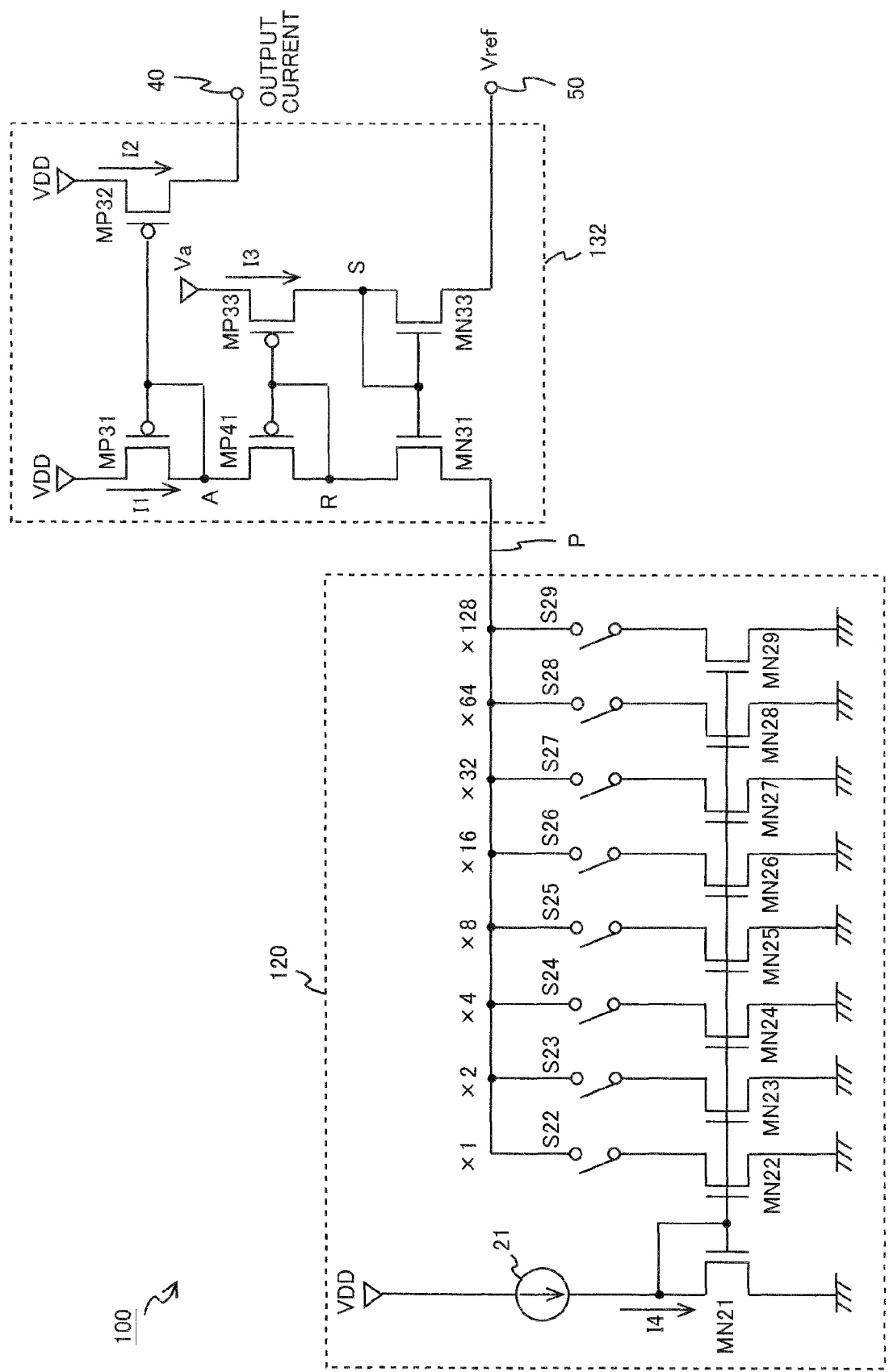
FIG. 8 is an example of another circuit configuration of the DAC circuit of the first exemplary embodiment.

FIG. 8 is a modified example of an output-stage current mirror circuit. As shown in FIG. 8, in the DAC 100 an output-stage current mirror circuit 132 includes PMOS transistors MP31, MP32, MP33, and MP41, and NMOS transistors MN31 and MN33.

The PMOS transistors MP41 and MP32 form a current mirror circuit having the transistor MP41 as the input transistor. The PMOS transistors MP31 and MP32 form a current mirror circuit having the transistor MP31 as the input transistor. The NMOS transistors MN31 and MN33 form a current mirror circuit having the transistor MN33 as the input transistor. The drain of transistor MP32 is connected to the output terminal 40, and the mirror current flowing in the transistor MP32 is the output current of the DAC 100.

Here, the connected configuration of the transistors MP31, MP32, MN31, MN33 is similar to that of the output-stage current mirror circuit 130 of FIG. 1. In the circuit configuration in FIG. 1, the transistor MP31 serves as the input transistor for the current mirror circuits of both transistors MP33 and MP32, but in the output-stage current mirror circuit 132 of FIG. 8, the transistor MP41 is used as the input transistor of the current mirror circuit formed by the transistor MP33. However, control is necessary such that the same voltage as the voltage at node A is supplied to the voltage terminal Va connected to the source of the transistor MP33.

Second Exemplary Embodiment

Below, a specific the second exemplary embodiment to which the invention is applied is explained in detail, referring to the drawings. In the second exemplary embodiment, an output-stage current mirror circuit 230 is formed using two of the output-stage current mirror circuits 130 of the first exemplary embodiment, in a differential current output type DAC 200. Portions which are assigned the same symbols as in the first exemplary embodiment have similar configurations, and so an explanation is omitted.

Figure 9:
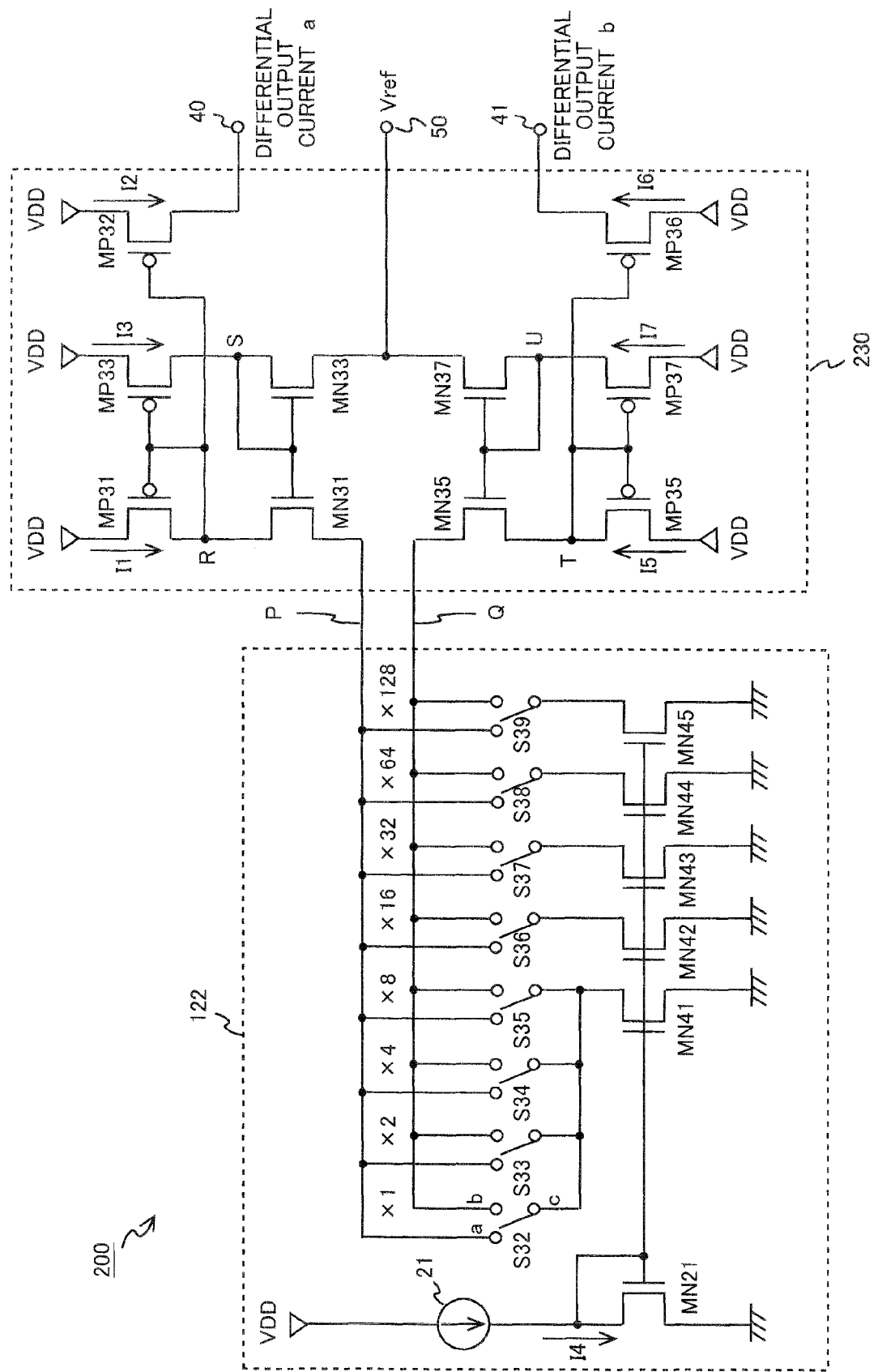
FIG. 9 shows the circuit configuration of the DAC circuit of a second exemplary embodiment.

As shown in FIG. 9, the digital/analog conversion circuit 200 includes a digital/analog conversion portion 122 and an output-stage current mirror circuit 230. The digital/analog conversion portion 122 and output-stage current mirror circuit 230 are connected at node P and node Q.

Upon input of a digital code, the digital/analog conversion portion 122 outputs current in an amount corresponding to the digital code to the output-stage current mirror circuit 230. Because the configuration of this digital/analog conversion portion 122 is substantially the same as the circuit configuration of the digital/analog conversion portion 122 in FIG. 3, a detailed explanation is omitted. However, a point of difference with FIG. 3 is the fact that the output-stage current mirror circuit 230 is connected with the terminals a of the switches connected to node P and the terminals b connected to node Q. For this reason, when terminals c and b are connected by a certain switch, a current corresponding to the switch digit weighting is output to node Q, and is not output to node P. Conversely, when terminals c and a are connected by a certain switch, a current corresponding to the switch digit weighting is output to node P, and is not output to node Q. In this way, the currents output to node P and to node Q are related differentially. The currents output to node P and node Q are the currents I1 and I5 respectively, flowing in the output-stage current mirror circuit 230.

The output-stage current mirror circuit 230 includes PMOS transistors MP31, MP32, MP33, MP35, MP36, MP37, and NMOS transistors MN31, MN33, MN35, MN37. Here, the transistors MP31 and MP35, the transistors MP32 and MP36, the transistors MP33 and MP37, the transistors MN31 and MN35, and the transistors MN33 and MN37 are the same size.

The source of the transistor MP31 is connected to the power supply voltage terminal VDD, and the drain and gate are connected to the node R. The source of the transistor MP32 is connected to the power supply voltage terminal VDD, the drain is connected to the output terminal 40, and the gate is connected to the node R. The source of the transistor MP33 is connected to the power supply voltage terminal VDD, the drain is connected to the node S, and the gate is connected to the node R. The drain of the transistor MN31 is connected to the node R, the source is connected to the node P, and the gate is connected to the node S. The drain and gate of the transistor MN33 are connected to the node S, and the source is connected to the reference voltage terminal 50. The reference voltage Vref is supplied to the reference voltage terminal 50.

Here, the transistors MP32 and MP33 form a current mirror circuit with the transistor MP31 as an input transistor. The transistor MN31 forms a current mirror circuit with the transistor MN33 as an input transistor. Hence the current I1 flowing in the transistor MP31 and the mirror current I3 corresponding to the current I1 flow in the transistor MP33.

Similarly, the mirror current I2 corresponding to the current I1 flows in the transistor MP32. This current I2 is output from the output terminal 40 as the differential output current a of the DAC 200.

The source of the transistor MP35 is connected to the power supply voltage terminal VDD, and the drain and gate are connected to the node T. The source of the transistor MP36 is connected to the power supply voltage terminal VDD, the drain is connected to the output terminal 41, and the gate is connected to the node T. The source of the transistor MP37 is connected to the power supply voltage terminal VDD, the drain is connected to the node U, and the gate is connected to the node T. The drain of the transistor MN35 is connected to the node T, the source is connected to the node Q, and the gate is connected to the node U. The drain and gate of the transistor MN37 are connected to the node U, and the source is connected to the reference voltage terminal 50.

Here, the transistors MP36 and MP37 form a current mirror circuit with the transistor MP35 as an input transistor. And, the transistor MN35 forms a current mirror circuit with the transistor MN37 as an input transistor. Hence when the current I5 flows in the transistor MP35, a mirror current I7 corresponding to the current I5 flows in the transistor MP37. Similarly, a mirror current I6 corresponding to the current I5 flows in the transistor MP36. This current I6 is output from the output terminal 41 as the differential output current b of the DAC 200.

The configuration of the circuit including the transistors MP31, MP32, MP33, MN31, MN33 and the circuit including the transistors MP35, MP36, MP37, MN35, MN37 of the second exemplary embodiment is similar to the configuration of the output-stage current mirror circuit 130 of the first exemplary embodiment. Hence similarly to the first exemplary embodiment, even when there is change in the currents I1 and I5, which are the output currents from the digital/analog conversion portion 122, the potentials at nodes P and Q are fixed at the reference voltage Vref and do not change. Hence the problem in the DAC 10 of the related art, in which there is worsening of the balance of the digit weightings for bits of transistors included by the digital/analog conversion portion due to the Early effect resulting from fluctuation of the potentials at the current output points (nodes P and Q) from the digital/analog conversion portion, can be resolved in the circuit configuration of the second exemplary embodiment as well.

Figure 11:
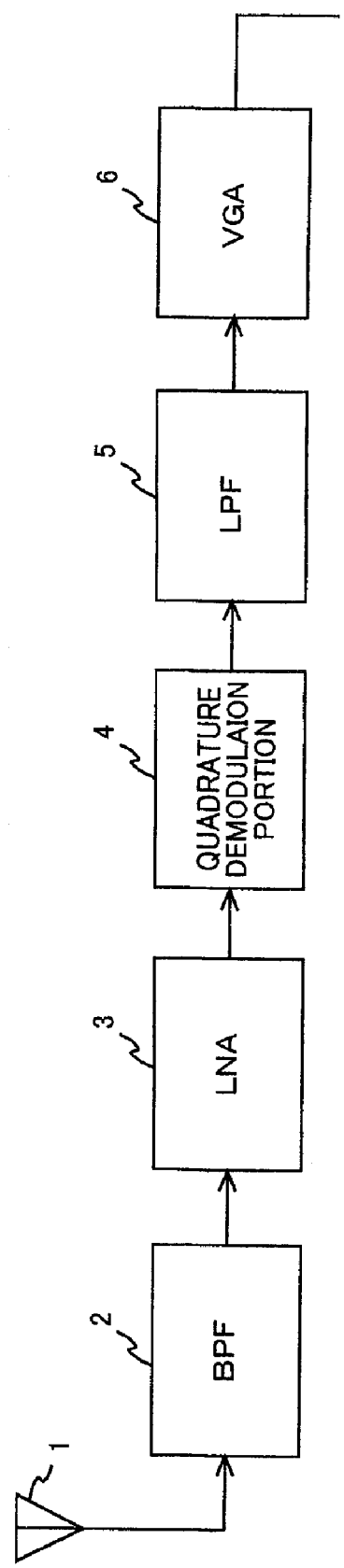
FIG. 11 shows the block configuration of a UWB receiver.
Figure 12:
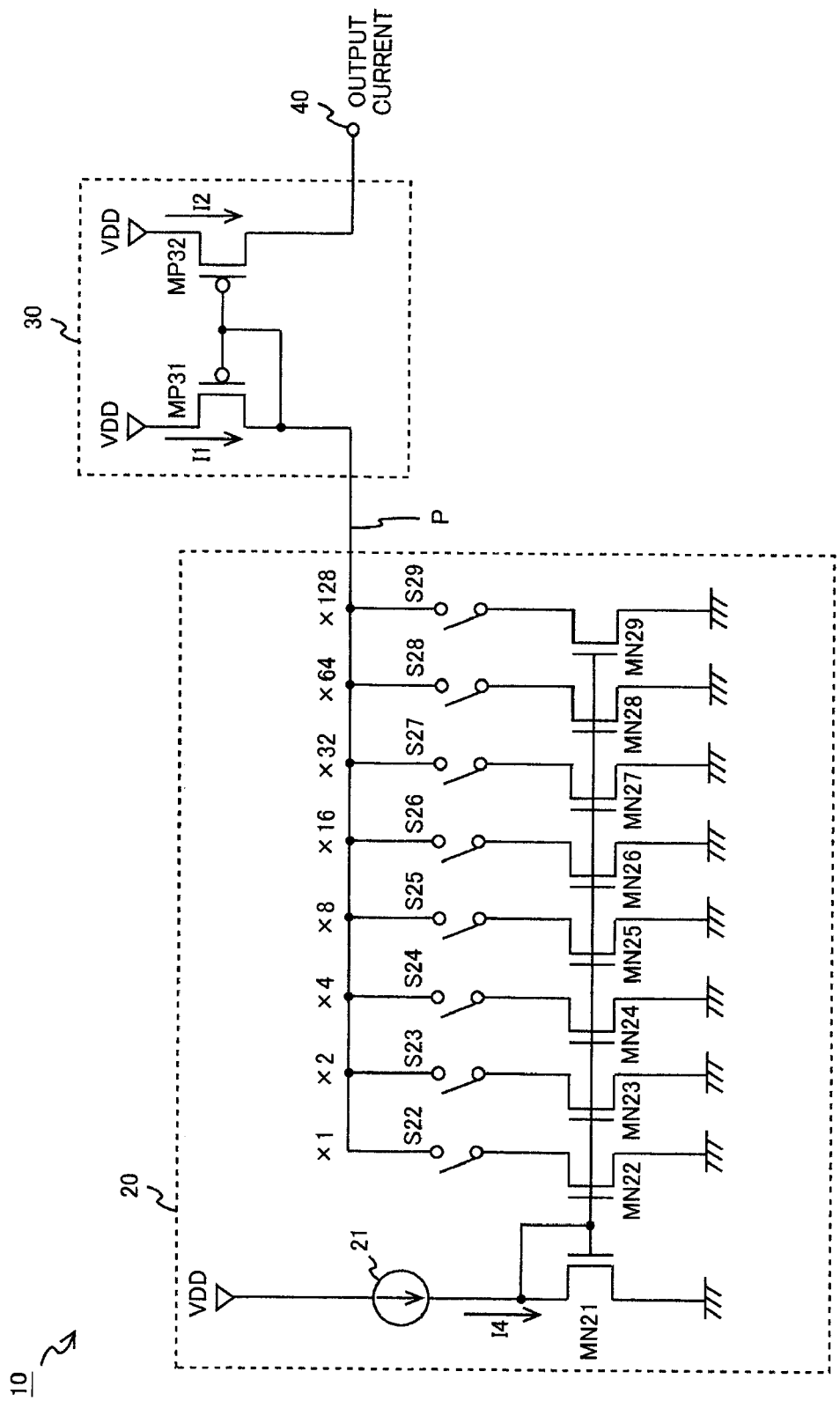
FIG. 12 shows the circuit configuration of a DAC circuit of the related art.

In the variable-gain amplifier (VGA) of a UWB receiver or similar such as shown in FIG. 11, often differential signals are used. Due to relative errors occurring in elements processing different parts of differential signals in a VGA which utilizes differential signals, there is the problem that the operating points of elements may shift for the different parts of the differential signal. This shift in operating points appears as a VGA offset. When the VGA gain is high, and this offset in the signal output from the VGA is also amplified, and there is a large effect on the reception characteristics of the receiver. This deterioration in reception characteristics appears, specifically, as deterioration in the communication distance or similar. For this reason, in UWB wireless communication, offsets in the receiver and similar must be kept as small as possible. Hence in order to reduce to the extent possible relative errors in elements processing different parts of differential signals in a VGA, and reduce deterioration of reception characteristics, a DAC for high-precision offset compensation is necessary.

As explained above, in the DAC of the second exemplary embodiment, fluctuations in the potentials at nodes P and Q due to the Early effect are suppressed, and the output current from the differential current output type digital/analog conversion portion is accurately amplified and output. Hence because a VGA uses the DAC of the second exemplary embodiment, relative errors in elements processing different parts of a differential signal, which had been a problem in the related art, are reduced, and deterioration of reception characteristics can be decreased.

The digital/analog conversion portion connected to the output-stage current mirror circuit 230 in the second exemplary embodiment may have a current cell type configuration, as in the output-stage current mirror circuit 121 of FIG. 2. And, the digital/analog conversion portion may have a segment current type configuration. Also, the terminals supplying the reference voltage Vref may be made separate, and respectively connected to the sources of the transistors MN33 and MN37.

Figure 10:
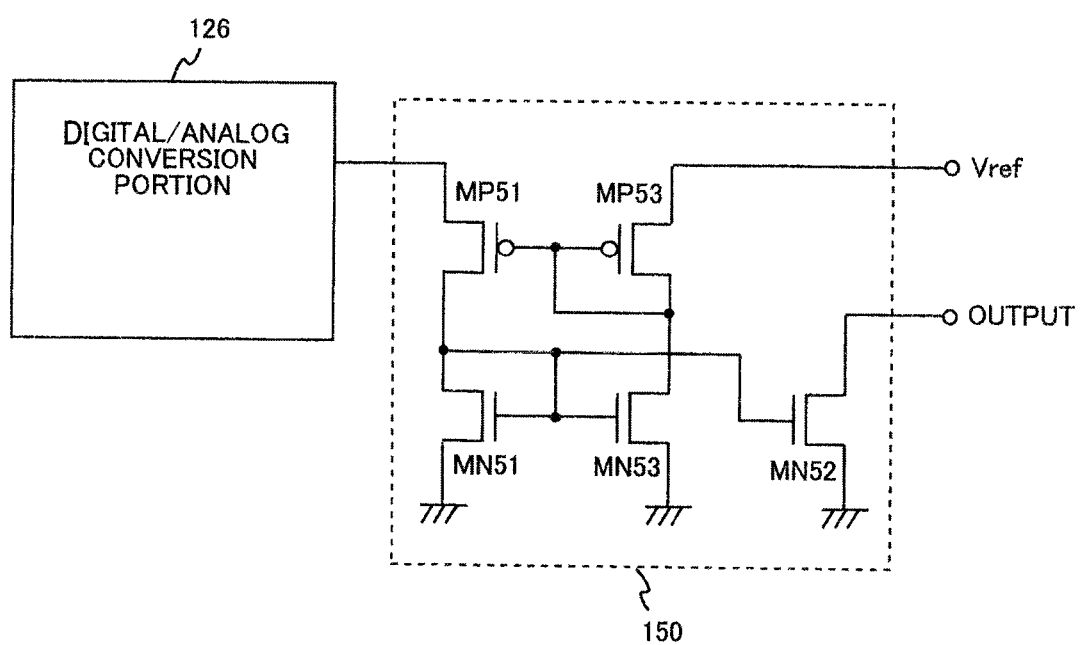
FIG. 10 shows the circuit configuration of the DAC circuit of another exemplary embodiment.

This invention is not limited to the above exemplary embodiments, and appropriate modifications can be made without deviating from the gist of the invention. For example, a DAC circuit 300 may be employed having an output-stage current mirror circuit 150 including NMOS transistors MN51, MN52, MN53 and PMOS transistors MP51, MP53, as shown in FIG. 10. The output-stage current mirror circuit 150 of this DAC circuit 300 has a circuit configuration which reverses the conduction types of transistors and the relation between the power supply voltage and ground voltage in the output-stage current mirror circuit 130 of FIG. 1. The digital/analog conversion portion 126 connected to this output-stage current mirror circuit 150 must have a circuit configuration which supplies a positive current to the output-stage current mirror circuit 150.

Further, in any of the above-described exemplary embodiments, PMOS transistors may be replaced with PNP type bipolar transistors, and NMOS transistors may be replaced with NPN type bipolar transistors. Also, the above-described digital/analog conversion portions are configured for 8-bit input digital codes, but application to N bits (where N is an integer greater than or equal to 1) is possible.

The first and second exemplary embodiments can be combined as desirable one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that the Applicant's intent is to encompass equivalents of all claim elements, even if amended later during prosecution.

What is claimed is:

1. A digital/analog conversion circuit, comprising:
a digital/analog conversion portion which outputs a first current according to an input digital signal; and
a first current mirror circuit which generates a mirror current according to the first current and outputs the mirror current as an analog signal,
the digital/analog conversion circuit converting the digital signal into the analog signal, and further comprising:
a second current mirror circuit, which generates a first mirror current according to the first current; and
a third current mirror circuit, which is connected to a reference voltage, and to which the first mirror current is input, and which generates a second mirror current equal to the first current, according to the first mirror current, between the digital/analog conversion portion and the second current mirror circuit,
wherein an input-side transistor of the third current mirror circuit is connected to the reference voltage, and an output-side transistor of the third current mirror is connected to the digital/analog conversion portion.

2. The digital/analog conversion circuit according to claim 1, wherein a single transistor is used as both an input-side transistor of the first current mirror circuit and as an input-side transistor of the second current mirror circuit.

3. The digital/analog conversion circuit according to claim 1, wherein current ratios of mirror currents of the second current mirror circuit and of the third current mirror circuit are substantially the same.

4. The digital/analog conversion circuit according to claim 1, wherein a conduction type of the transistors of the first and second current mirror circuits, and a conduction type of the transistor of the third current mirror circuit, are different.

5. The digital/analog conversion circuit according to claim 1, wherein the transistors of the first through third current mirror circuits are MOS type transistors or are bipolar type transistors.

6. The digital/analog conversion circuit according to claim 1, wherein the digital/analog conversion portion is configured as a current cell type circuit, or as a segment current type circuit, or as a circuit which combines a current cell type circuit and a segment current type circuit.

7. A digital/analog conversion circuit, comprising:
a digital/analog conversion portion which outputs a first current and a second current in a differential relationship according to input digital signals; and
first and fourth current mirror circuits which generate mirror currents according to the first and second currents for output as differential analog signals,
the digital/analog conversion circuit converting the digital signals into the analog signals, and further comprising:
a second current mirror circuit, which generates a first mirror current according to the first current;
a third current mirror circuit, which is connected to a reference voltage, and to which the first mirror current is input, and which generates a second mirror current equal to the first current, according to the first mirror current, between the digital/analog conversion portion and the second current mirror circuit;
a fifth current mirror circuit, which generates a third mirror current according to the second current; and
a sixth current mirror circuit, which is connected to the reference voltage, and to which the third mirror current is input, and which generates a fourth mirror current equal to the second current, according to the third mirror current, between the digital/analog conversion portion and the fifth current mirror circuit.

8. The digital/analog conversion circuit according to claim 7, wherein a single transistor is used as both an input-side transistor of the first current mirror circuit and as an input-side transistor of the second current mirror circuit.

9. The digital/analog conversion circuit according to claim 7, wherein the input-side transistor of the third current mirror circuit is connected to the reference voltage and an output-side transistor is connected to the digital/analog conversion portion, and the input-side transistor of the sixth current mirror circuit is connected to the reference voltage and the output-side transistor is connected to the digital/analog conversion portion.

10. The digital/analog conversion circuit according to claim 9, wherein the input-side transistors of the third and sixth current mirror circuits are connected to the same terminal supplying the reference voltage.

11. The digital/analog conversion circuit according to claim 9, wherein the input-side transistors of the third and sixth current mirror circuits are connected to first and second terminals, respectively, supplying the reference voltage.

12. The digital/analog conversion circuit according to claim 7, wherein current ratios of mirror currents of the second current mirror circuit and of the third current mirror circuit are substantially the same, and current ratios of mirror currents of the fifth current mirror circuit and of the sixth current mirror circuit are substantially the same.

13. The digital/analog conversion circuit according to claim 7, wherein a conduction type of the transistors of the first, second, fourth, and fifth current mirror circuits, and a conduction type of the transistors of the third and sixth current mirror circuits, are different.

14. The digital/analog conversion circuit according to claim 7, wherein the transistors of the first through sixth current mirror circuits are MOS type transistors or are bipolar type transistors.

15. The digital/analog conversion circuit according to claim 7, wherein the digital/analog conversion portion is configured as a current cell type circuit, or as a segment current type circuit, or as a circuit which combines a current cell type circuit and a segment current type circuit.

* * * * *